United States Patent [19]

Bulucea et al.

[11] Patent Number: 5,441,900

[45] Date of Patent: Aug. 15, 1995

[54] CMOS LATCHUP SUPPRESSION BY LOCALIZED MINORITY CARRIER LIFETIME REDUCTION

[75] Inventors: Constantin Bulucea, Milpitas; Esin Dermirlioglu, Cupertino; Sheldon Aronowitz, San Jose, all of Calif.

[73] Assignee: National Semiconductor Corporation, Santa Clara, Calif.

[21] Appl. No.: 308,698

[22] Filed: Sep. 19, 1994

Related U.S. Application Data

[62] Division of Ser. No. 28,456, Mar. 9, 1993, Pat. No. 5,384,477.

[51] Int. Cl.$^6$ .......................................... H01L 21/265
[52] U.S. Cl. .......................................... 437/24; 437/26; 437/142; 437/959; 148/DIG. 23
[58] Field of Search ....................... 437/24, 959, 142, 26; 148/DIG. 23

[56] References Cited

U.S. PATENT DOCUMENTS

| | | | |
|---|---|---|---|
| 3,662,232 | 5/1972 | Stahr | 437/142 |
| 3,808,473 | 4/1974 | Yamashita et al. | 317/235 |
| 4,007,297 | 2/1977 | Robinson et al. | 427/93 |
| 4,047,976 | 9/1977 | Bledsoe et al. | 437/24 |
| 4,053,925 | 10/1977 | Burr et al. | 356/64 |
| 4,082,571 | 4/1978 | Gravi et al. | 437/24 |
| 4,107,731 | 8/1978 | Naito et al. | 437/142 |
| 4,184,897 | 1/1980 | Anthony et al. | 437/142 |
| 4,383,268 | 5/1983 | Martinelli et al. | 357/34 |
| 4,762,802 | 8/1988 | Parillo | 437/24 |
| 4,920,396 | 4/1990 | Shinohara et al. | 357/42 |
| 5,371,040 | 12/1994 | Graff et al. | 148/DIG. 23 |

FOREIGN PATENT DOCUMENTS

| | | | |
|---|---|---|---|
| 53-7577 | 1/1978 | Japan | 437/142 |
| 55-145375 | 11/1980 | Japan | 437/142 |
| 1-120055 | 5/1989 | Japan | 257/372 |
| 3-218661 | 9/1991 | Japan | 257/372 |

OTHER PUBLICATIONS

Lisiak, K. P., et al., Solid State Electronics, 19 (1976) 115 "Rhodium and Iridium as Deep Impurities in Silicon".

R. S. Muller and T. I. Kamins, Device Electronics for Integrated Circuits, 2nd Edition, Section 5.2, pp. 209–218, published by John Wiley (1986).

R. R. Troutman, Latchup in CMOS Technology, Kluwer Academic, Boston, 1986 (Section 6.2). TK 7871.99.M44 T76, pp. 174–181.

W. R. Dawes, Jr., and G. F. Derbenwick, Prevention of CMOS Latchup by Gold Doping, IEEE Trans. Nucl. Sci., NS-23, pp. 2027–2030 (Dec. 1976).

A. Mongro-Campero and R. P. Love, Carrier Lifetime Reduction by Argon Implantation into Silicon, J. Electrochem. Soc. 131, pp. 655–660 (Mar. 1984).

A. G. Cullis, T. E. Seidel, and R. L. Meek, Comparative Study of Annealed Neon-, Argon-, Krypton-Ion Implantation Damage in Silicon, J. Appl. Phys. 49, pp. 5188–5198 (Oct. 1978).

(List continued on next page.)

Primary Examiner—Brian E. Hearn
Assistant Examiner—Leon Radomsky
Attorney, Agent, or Firm—Limbach & Limbach; H. Donald Nelson; Stephen R. Robinson

[57] ABSTRACT

A unique approach to suppressing latchup in CMOS structures is described. Atomic species that exhibit midgap levels in silicon and satisfy the criteria for localized action and electrical compatibility can be implanted to suppress the parasitic bipolar behavior which causes latchup. Reduction of minority carrier lifetime can be achieved in critical parasitic bipolar regions that, by CMOS construction are outside the regions of active MOS devices. One way to accomplish this goal is to use the source/drain masks to locally implant the minority carrier lifetime reducer (MCLR) before the source/drain dopants are implanted. This permits the MCLR to be introduced at different depths or even to be different species, of the n and p-channel transistors. Another way to accomplish this goal requires that a blanket MCLR implant be done very early in the process, before isolation oxidation, gate oxidation or active threshold implants are done.

6 Claims, 3 Drawing Sheets

OTHER PUBLICATIONS

Nuclear and Space Radiation Effects Conf., pp. 5069–5073 Jul. 19, 1979.

M. Wittmer, J. Roth, P. Revesz, and J. W. Mayer, Epitaxial Regrowth of Ne- and Kr-Implanted Amorphous Silicon, J. Appl. Phys. 49, pp. 5207–5212 (Oct. 1978).

P. Revesz, M. Wittmer, J. Roth and J. W. Mayer, Epitaxial Regrowth of Ar-Implanted Amorphous Silicon, J. Appl. Phys. 49, pp. 5199–5206 (Oct. 1978).

M. Delfino, A. Milgram, and M. D. Strathman, Epitaxial Regrowth of Silicon Implanted with Argon and Boron, Appl. Phys. Lett., 44, pp. 594–596 (Mar. 1984).

S. Aronowitz, Quantum-Chemical Modeling of Boron and Noble Gas Dopants on Silicon, J. Appl. Phys. 54, pp. 3930–3934 (Jul. 1983).

J. W. Chen and A. G. Milnes, Energy Levels in Silicon, Ann. Rev. Mater. Sci. 10, pp. 157–228 (1980).

S. Aronowitz, H. P. Zappe, and C. Hu, Effective Charge Modification Between $SiO_2$ and Silicon, J. Electrochem. Soc. 136, pp. 2368–2370 (Aug. 1989).

D. H. Weiner, S. S. Wong, and C. I. Drowley, Oxygen Implantation for Internal Gettering and Reducing Carrier Lifetime, Appl. Phys. Lett. 50, pp. 986–988 (Apr. 1987).

S. Rathnaphanyarat, P. Renteln, C. I. Drowley, and S. S. Wong, Oxygen Implantation to Suppress Parasitic Bipolar Action in CMOS, IEEE Trans. Electron Devices 38, pp. 355–363 (Feb. 1991).

J. R. Adams and R. J. Sokel, Neutron Irradiation for Prevention of Latch-up in MOS Integrated Circuits,

CMOS LATCHUP SUPPRESSION BY LOCALIZED MINORITY CARRIER LIFETIME REDUCTION

This is a divisional of application Ser. No. 08/028,456, filed Mar. 9, 1993, now U.S. Pat. No. 5,384,477.

BACKGROUND OF THE INVENTION

Conventional complementary metal oxide semiconductor (CMOS) circuits are inherently susceptible to latchup due to the presence of parasitic bipolar transistors in their construction. See R. S. Muller and T. I. Kamins, DEVICE ELECTRONICS FOR INTEGRATED CIRCUITS, 2nd Edition, John Wiley, 1986. FIG. 1 is a simplified cross-section of a conventional prior art p-type substrate CMOS inverter circuit 6, where the parasitic bipolar transistors are labeled 11-14 and $+V_{DD}$ is applied at terminal 9 and $-V_{SS}$ is applied at terminal 10. $V_{in}$ 15 and $V_{out}$ 16 are the input and output terminals. Resistors 17 and 18 are the series resistors associated with the parasitic current flow in the substrate 7 and n-type well 8 respectively. N+ source-/drain regions 20-21 comprise an N-channel transistor while P+ drain/source regions 23-24 comprise the P-channel transistor. P+ region 22 forms an ohmic substrate 7 contact and N+ region 25 forms an ohmic P-well 8 contact.

Methods for reducing the chance of latchup without altering the recombination properties of the semiconductor crystal include
(1) decoupling the bipolar interaction by dielectric isolation, or
(2) degrading the current gain of the parasitic bipolar transistors. The first approach, while offering total suppression of latchup, involves complicated processing, which makes it impractical. The second approach attempts to reduce parasitic transisor action by manipulating active dopant distributions. The use of dual (twin) wells with epitaxial substrate, and of retrograde wells are some of the most effective dopant schemes. See Muller and Karoins (above and R. R. Troutman, LATCHUP IN CMOS TECHNOLOGY, Kluwer Academic, 1986.

Parasitic bipolar action also can be minimized by reducing carrier lifetimes around the regions where bipolar action takes place. Lifetime reduction can be achieved by introducing the known "lifetime killer" gold into silicon, or by exposing the devices to neutron irradiation. See W. R. Dawes, Jr., and G. F. Derbenwick, "Prevention of CMOS Latchup by Gold Doping", IEEE Trans. Nucl. Sci., NS-23, 2027 (1976). Also see J. R. Adams and R. J. Sokcel, "Neutron Irradiation for Prevention of Latchup in MOS Integrated Circuits", Nuclear and Space Radiation Effects Conf., Jul. 19, 1979. However, gold is a very fast diffuser and cannot be easily localized. The neutron flux is also global for either technique. One adverse effect is an undesired increase in current leakage.

An approach will be detailed that, while degrading the performances of the parasitic bipolar devices, does not affect the electrical performances of the CMOS circuit. It will, in fact, substantially improve the latchup immunity of the circuit.

SUMMARY OF THE INVENTION

It is an object of the invention to reduce or suppress latchup in a CMOS integrated circuit.

It is a further object of the invention to reduce latchup in a CMOS integrated circuit by reducing the current gain in the parasitic bipolar transistors associated with the active MOS transistor.

It is a still further object of the invention to ion implant a minority carrier lifetime reducer (hereafter MCLR) impurity into a CMOS integrated circuit chip so that the impurity is located in the active region of the parasitic bipolar transistor elements.

These and other objects are achieved using the invention. A key to the invention is that the active device regions in conventional CMOS structures are near the silicon interface, while the parasitic bipolar devices extend into the bulk. Active MOS devices in current CMOS structures are less than 300 nm deep. By comparison, the n-well of a typical CMOS process is in the range of 1,200 to 2,000 nm deep. Therefore, placing an MCLR at 600 nm to 1,000 nm below the surface would substantially increase recombination in the base of the parasitic bipolar transistors, while not affecting the properties of the active MOS devices.

Two embodiments of the invention will be disclosed. In the first one, which is represented in FIG. 2, the MCLR is implanted through the source/drain masks of the n-channel and p-channel MOS devices in the fabrication process. Regions of reduced minority carrier lifetimes are formed below each p+/n or n+/p junction, where the bases of the parasitic bipolar transistors are. FIG. 2 illustrates the substantial reduction of the minority carrier current flows coming out of these regions due to increased recombination there. FIG. 2 also illustrates the further reduction of the current flowing toward the bias supply connection due to the detouring of a part of it into the base of the respective complementary bipolar transistor. As a result, the total current flow between the bias terminals $V_{DD}$ and $V_{SS}$ is reduced to a minimum leakage value. Only two of the four parasitic bipolar transistors participating into the latchup process are represented in FIG. 2, for graphical simplification.

Since the MCLR implant precedes that of the source/drain dopant implant, no additional critical masks are required. However, high temperature steps following the source/drain implantations may not be sufficient for complete epitaxial regrowth of the argon-implanted regions. Moreover, since implant energies, in the range of 600 keV are required for argon, with even greater energies required for heavier species, the masking layers will have to be made thick enough to avoid near surface implantation through the mask.

The desired projected range for the MCLR species is about 600 nm for a typical 1,200 nm well and the necessary implant energy if the MCLR was argon would be about 600 keV. The appropriate dose for significant MCLR behavior would equal approximately $2 \times 10^{14}$ Ar+/cm². In the case of FIG. 1, the MCLR species could be introduced at different depths, if desired. The need could arise because of differing depths of active device regions. Moreover, different species can be used for the n- and p-channel regions, if necessary.

The second embodiment of the invention is represented in FIG. 3. A blanket MCLR implant is made during the fabrication process before field oxidation, field implant, active region threshold adjust implant and gate oxidation. The desired projected range for the MCLR dopant is about 600 nm. The subsequent field oxidation, which is a high temperature process, will result in epitaxial regrowth and will anneal gross damage. Because the argon is implanted before the field implant (boron), the boron diffusion will be retarded. See the M. Delfino, A. Milgram and M. D. Strathman reference cited below. While offering maximum process simplicity, this preferred method has the theoretical disadvantage that the band of degraded minority carrier lifetime intersects the metallurgical junction of the n-type well, causing localized increased leakage under reverse bias conditions. Fortunately, the region of intersection is small compared to the total extension of the well junction, which makes this increased leakage contribution relatively minor with respect to the total leakage figure of the junction (see FIG. 3).

DESCRIPTION OF THE INVENTION

Figure 1:
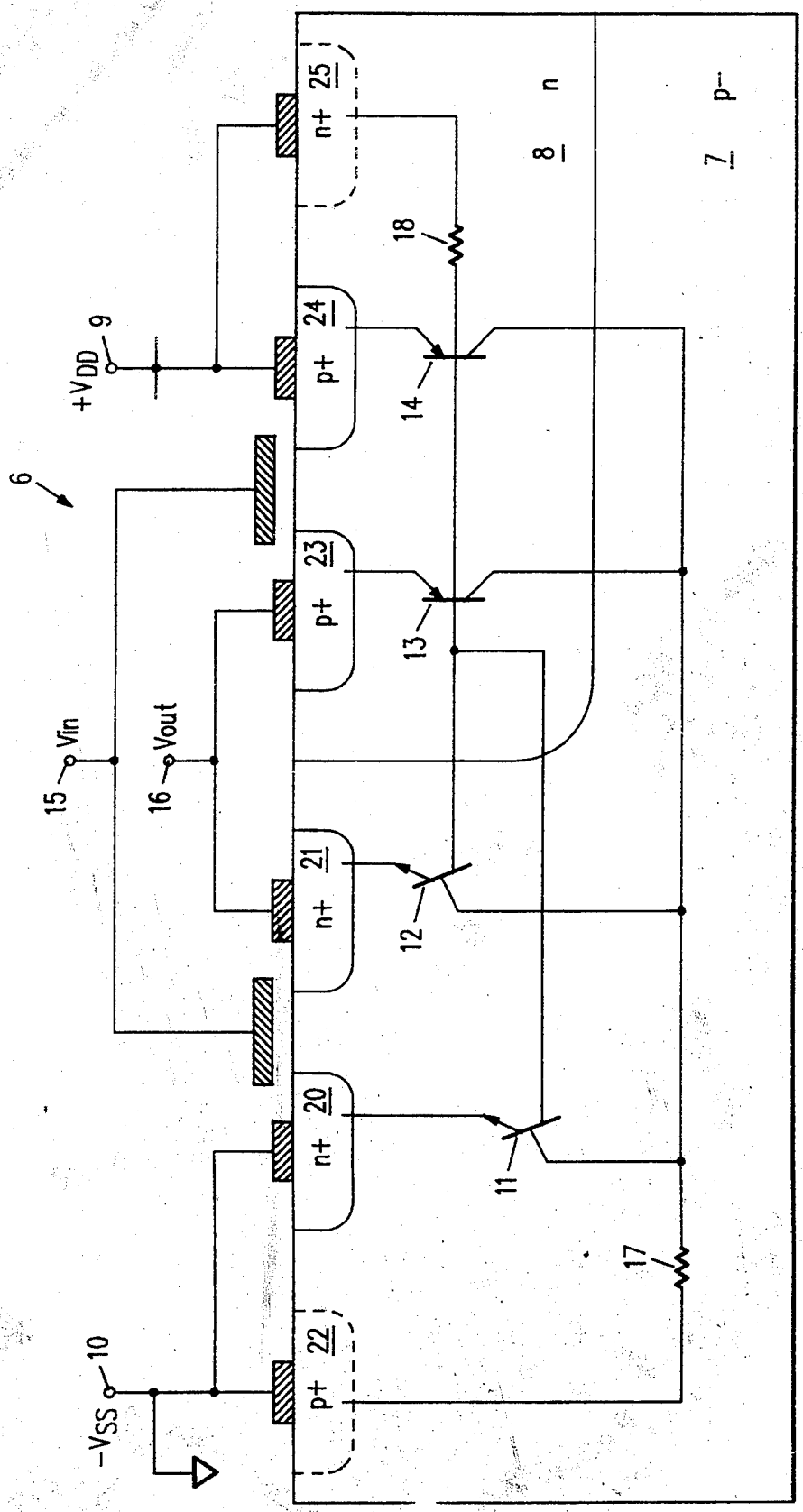
FIG. 1 is a simplified cross-section of a conventional prior art CMOS inverter circuit. The parasitic bipolar transistors are labeled 11–14. The series resistors associated with the bipolar current flows in the substrate and in the n-type well are labeled 17 and 18, respectively.

The invention is based upon three sets of experimental observations complemented by theoretical results:
(1) Argon can significantly reduce minority carrier lifetime in silicon. See A. Mongro-Campero and R. P. Love, "Carrier Lifetime Reduction by Argon Implantation into Silicon" J. Electrochem. Soc. 131, 655 (1984).
(2) Below a critical concentration, unique to each noble gas, complete epitaxial regrowth of silicon after implantation of that noble gas can be achieved. See A. G. Cullis, T. E. Seidel and R. L. Meek, "Comparative Study of Annealed Neon-Argon-Krypton-Ion Implantation Damage in Silicon" J. Appl. Phys. 49, 5188 (1978). Also see M. Wittmer, J. Roth, P. Revesz and J. W. Mayer, "Epitaxial Regrowth of Ne- and Kr-Implanted Amorphous Silicon", J. Appl. Phys. 49, 5207 (1978).
(3) Argon can be localized in silicon. See P. Revesz, M. Wittmer, J. Roth and J. M. Mayer, "Epitaxial Regrowth of Ar-Implanted Amorphous Silicon", J. Appl. Phys. 49, 5199 (1978). See also M. Delfino, A. Milgram and M. D. Strathman, "Epitaxial Regrowth of Silicon Implanted with Argon and Boron", Appl. Phys. Lett. 44, 594 (1984). Krypton is even more likely to be retained in a fixed position in silicon. See S. Aronowitz, "Quantum-Chemical Modeling of Boron and Noble Gas Dopants on Silicon", J. Appl. Phys. 54, 3930 (1983).

The ingredient that permits a dopant species to significantly reduce minority carrier lifetime is the generation of at least one energy level, commonly called deep level, around the center of the silicon bandgap. According to the classical theory of Hall, Shockley and Read, as described in Muller and Kamins, cited above, deep levels act as "stepping stones" during the electron-hole interaction, increasing recombination probability under forward bias conditions. Conversely, under reverse bias conditions, these levels increase the probability of thermal generation of electron-hole pairs. The recombination/generation rates are characterized, in quantitative terms, by the minority carrier lifetime, a local macroscopic property of the material. Typically, this parameter is greater than 10 $\mu$s for good quality single-crystal silicon (very low recombination/generation rates), and is smaller than 0.1 $\mu$s for damaged or stressed crystals (high recombination/generation rates).

There are three criteria that must be met before an atomic species is considered a suitable MCLR. They are as follows:
1. The species has to generate a deep impurity level in silicon in order to be an efficient generation/recombination center.
2. The diffusion coefficient of that species in silicon must be very small, to ensure localization.
3. The species must not adversely interfere with the electrical activity in the respective region.

Studies have shown that argon in silicon exhibits a midgap level. Also, the group II ($ns^2$) element calcium [(argon) $4s^2$] generates a level similar to argon. See J. W. Chen and A. G. Milnes, "Energy Levels in Silicon" Ann. Rev. Mater. Sci. 10, 157 (1980) Calcium has been determined to be a very inefficient n-type dopant, the activation of which is less than 0.1% when annealed at 1,100 C. for 30 minutes in nitrogen. See S. Aronowitz, H. P. Zappe and C. Hu, "Effective Charge Modification Between $SiO^2$ and Silicon", J. Electrochem Soc. 136, 2368 (1989).

Krypton displays a midgap level and is less mobile than argon. Similar to krypton, the group II element strontium [(krypton) $5s^2$] exhibits a mid-gap level in silicon.

There are critical concentrations of the noble gases above which epitaxial regrowth is suppressed. That concentration equals about $10^{20}$ cm$^{-3}$ for argon and is smaller for krypton. The critical concentrations of calcium and strontium are expected to be similar to those of their noble gas counterparts.

The implantation straggle parameter, $\Delta R_p$, is small for argon and krypton at the desired projected range $R_p$. Consequently, as is desirable, the near-surface concentrations of these MCLR species are low. The concentrations of active calcium and strontium are several orders of magnitude smaller than their respective chemical concentrations. Therefore, the net active concentrations in the bulk of the active MOS devices are unlikely to be affected, i.e., the respective threshold voltages will not change.

An element that has been used as an MCLR is the group VI ($ns^2np^4$) element oxygen (13, 14). The dose level needed to substantially reduce minority carrier lifetime is two orders of magnitude greater than with argon. As a result, the oxygen concentration near the surface of silicon is on the order of $10^{17}$ cm$^{-3}$, which is likely to affect the properties of active devices. Moreover, oxygen precipitates along with dislocations in the oxygen implanted regions (14) and is localized only in the sense that it has reacted with silicon. Because oxygen does not meet two of the three criteria, it is rejected from use as an MCLR species.

Other elements, such as the group 1 [(xenon) $6s^1$] element cesium, might make a suitable MCLR species. However, the implant energy required to achieve a projected range of about 600 nm falls in the range of several MeV. Due to only practical implantation constraints, cesium is not deemed suitable as an MCLR species.

Figure 2:
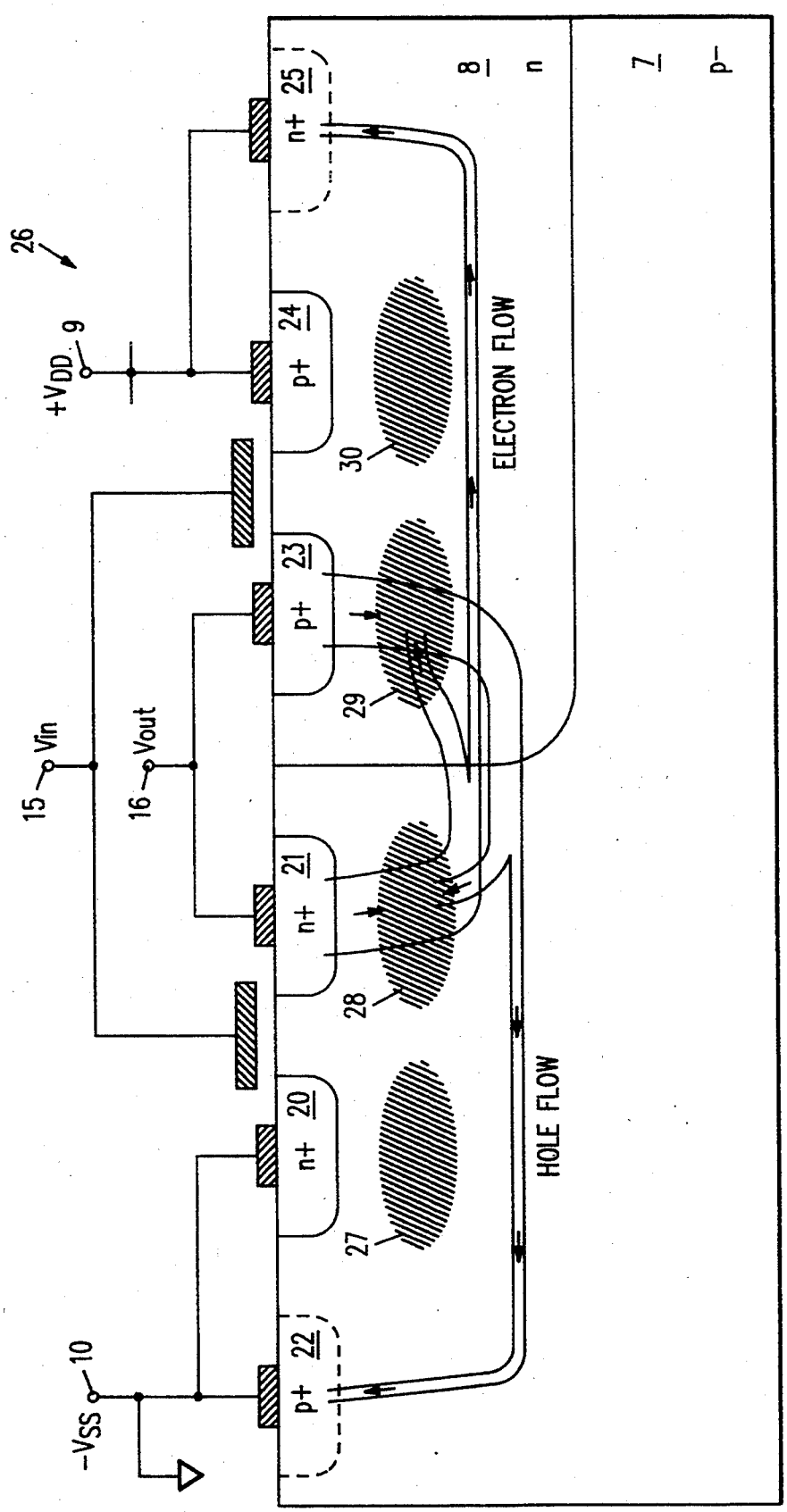
FIG. 2 is a cross-section representation of CMOS structure improved according to the first embodiment of this invention. MCLRs have been introduced below the source/drain regions, as represented by shaded areas 27–30. Arrows and flow lines illustrate the flow and recombination of electrons and holes in regions of interest. Only the current flow associated with two of the four parasitic bipolar transistors participating into the latchup process are represented, for graphical simplification.

In the FIG. 2 device 26, the MCLR impurities, which comprise the group consisting of argon, krypton, strontium and calcium, are ion implanted in regions 27–30. These regions lie directly under S/D regions 20, 21, 23 and 24 and are desirably formed using the same masking step employed in the CMOS S/D forming process step. The only requirement is that the mask employed be thick enough to mask the MCLR implant. It can be seen in FIG. 2 that the regions of reduced carrier lifetime are directly in the parasitic transistor active regions.

Figure 3:
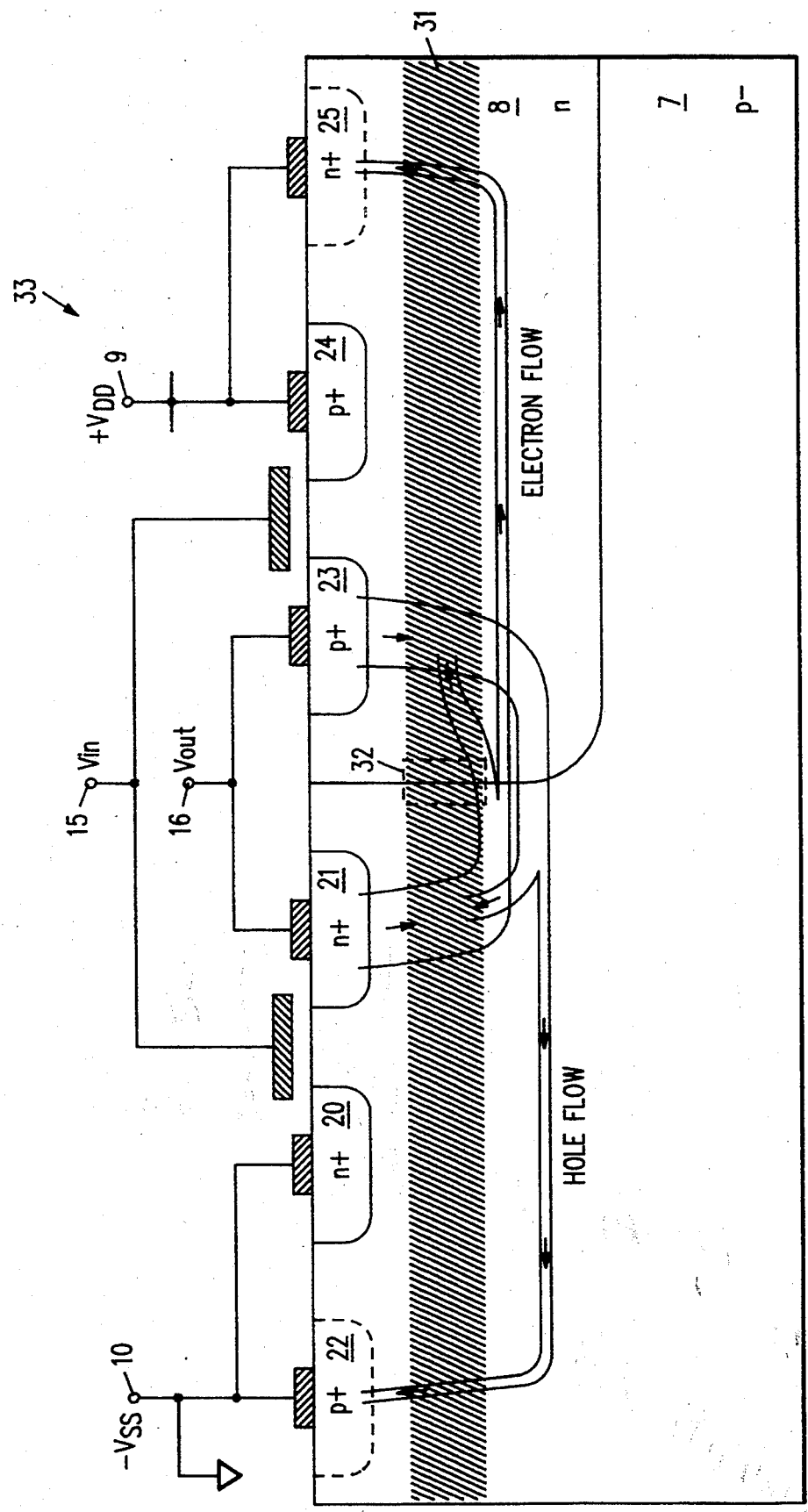
FIG. 3 is a cress-section representation of CMOS structure improved according to the second embodiment of this invention. MCLRs have been uniformly introduced below the surface, as represented by the shaded band 31. Arrows and flow lines illustrate the flow and recombination of electrons and holes in regions of interest. Only the current flow associated with two of the four parasitic bipolar transistors participating into the latchup process are represented, for graphical simplification. The small region 32 of increased carrier generation under reverse bias conditions is enclosed in the dashed rectangle at the intersection of the reduced minority carrier lifetime band with the metallurgical junction of the n-type well.

In the FIG. 3 device 33, the MCLR impurities are applied early in the CMOS process to form a single region 31. Since no masking is required it is a simple step and is early enough in the CMOS process that it is followed by a high temperature step that produces annealing of the ion implant silicon crystal damage. This method is preferred over the process employed with the FIG. 2 embodiment. Region 32 represents an area where the MCLR layer intersects the N-well junction and may result in a slightly increased leakage current. However, since only a very small portion of the PN junction is involved such leakage is minimal.

The invention has been described and a preferred embodiment detailed. An alternative has also been described. When a person skilled in the art reads the foregoing description, other alternatives and equivalents, within the spirit and intent of the invention, will be apparent. Accordingly, it is intended that the scope of the invention be limited only by the claims that follow.

We claim:

1. A method of manufacturing a CMOS integrated circuit with latchup suppression, said method comprising the steps of:
    defining a subsurface region of a silicon substrate, wherein the subsurface region is located beneath and is generally parallel to an upper surface of the silicon substrate;
    implanting minority carrier lifetime reducing impurities into the subsurface region of the silicon substrate, wherein the impurities are selected from the group consisting of calcium and strontium; and
    forming a plurality of transistors within the silicon substrate, wherein each transistor includes a source region and a drain region.

2. A method as recited in claim 1, wherein the step of defining a subsurface region of a silicon substrate comprises defining a single region.

3. A method as recited in claim 2, wherein the step of implanting minority carrier lifetime reducing impurities into the subsurface region of the silicon substrate precedes the step of forming a plurality of transistors within the silicon substrate.

4. A method of manufacturing a CMOS integrated circuit with latchup suppression, said method comprising the steps of:
    defining a subsurface region of a silicon substrate, wherein the subsurface region is located beneath and is generally parallel to an upper surface of the silicon substrate;
    implanting minority carrier lifetime reducing impurities through a plurality of pairs of regions within the upper surface of the silicon substrate and into the subsurface region of the silicon substrate, wherein within each one of the plurality of pairs of upper surface regions the impurities beneath one upper surface region are not in contact with the impurities beneath the other upper surface region, and wherein the impurities are selected from the group consisting of calcium and strontium; and
    forming a plurality of transistors within the silicon substrate, wherein each transistor includes a source region and a drain region, and wherein the source and drain regions for each transistor together comprise one pair of the plurality of pairs of upper surface regions.

5. A method of manufacturing a CMOS integrated circuit with latchup suppression, said method comprising the steps of:
    defining a plurality of subsurface regions of a silicon substrate, wherein each subsurface region is located beneath and is generally parallel to an upper surface of the silicon substrate;
    implanting minority carrier lifetime reducing impurities into the plurality of subsurface regions of the silicon substrate, wherein the impurities are selected from the group consisting of calcium and strontium; and
    forming a plurality of transistors within the silicon substrate, wherein each transistor includes a source region and a drain region.

6. A method as recited in claim 5, wherein the step of implanting minority carrier lifetime reducing impurities into the plurality of subsurface regions of the silicon substrate comprises implanting the minority carrier lifetime reducing impurities through the source and drain regions of each transistor.

* * * * *